(12) United States Patent
Weaver

(10) Patent No.: US 7,360,981 B2
(45) Date of Patent: Apr. 22, 2008

(54) DATUM PLATE FOR USE IN INSTALLATIONS OF SUBSTRATE HANDLING SYSTEMS

(75) Inventor: William Tyler Weaver, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/280,028

(22) Filed: Nov. 16, 2005

(65) Prior Publication Data

US 2006/0104749 A1     May 18, 2006

Related U.S. Application Data

(63) Continuation of application No. 10/186,256, filed on Jun. 28, 2002, now abandoned.

(60) Provisional application No. 60/302,114, filed on Jun. 30, 2001.

(51) Int. Cl.
*H01L 21/677* (2006.01)
(52) U.S. Cl. .................................................. 414/217
(58) Field of Classification Search ................ 414/217, 414/217.1, 935, 940
See application file for complete search history.

(56) References Cited

U.S. PATENT DOCUMENTS 4,775,281 A    10/1988   Prentakis
6,027,301 A    2/2000   Kim et al.
6,053,688 A    4/2000   Cheng
6,053,980 A    4/2000   Suda et al.
6,082,951 A    7/2000   Nering et al.
6,138,721 A    10/2000   Bonora et al.
6,249,342 B1   6/2001   Cheng
6,281,516 B1   8/2001   Bacchi et al.
6,283,692 B1   9/2001   Perlov et al.
6,540,869 B2   4/2003   Saeki et al.
2003/0044268 A1   3/2003   Bonora et al.

FOREIGN PATENT DOCUMENTS

WO    WO 00/33355     6/2000
WO    WO 01/10756 A1   2/2001

*Primary Examiner*—Charles A Fox
(74) *Attorney, Agent, or Firm*—Dugan & Dugan, PC

(57) ABSTRACT

A datum plate is provided for use in installations of substrate handling systems. The datum plate has a set of predetermined attachment locations adapted to couple the datum plate to a chamber; a set of predetermined attachment locations adapted to couple one or more automatic door opener platforms to the datum plate; and a set of predetermined attachment locations adapted to couple one or more substrate handlers contained within the chamber, to the datum plate. The attachment locations are positioned such that when the datum plate is coupled to the chamber, and the automatic door opener platform and the substrate handler are coupled to the datum plate, the substrate handler and automatic door opener platform are aligned for substrate transfer therebetween. Numerous other aspects are provided.

34 Claims, 15 Drawing Sheets

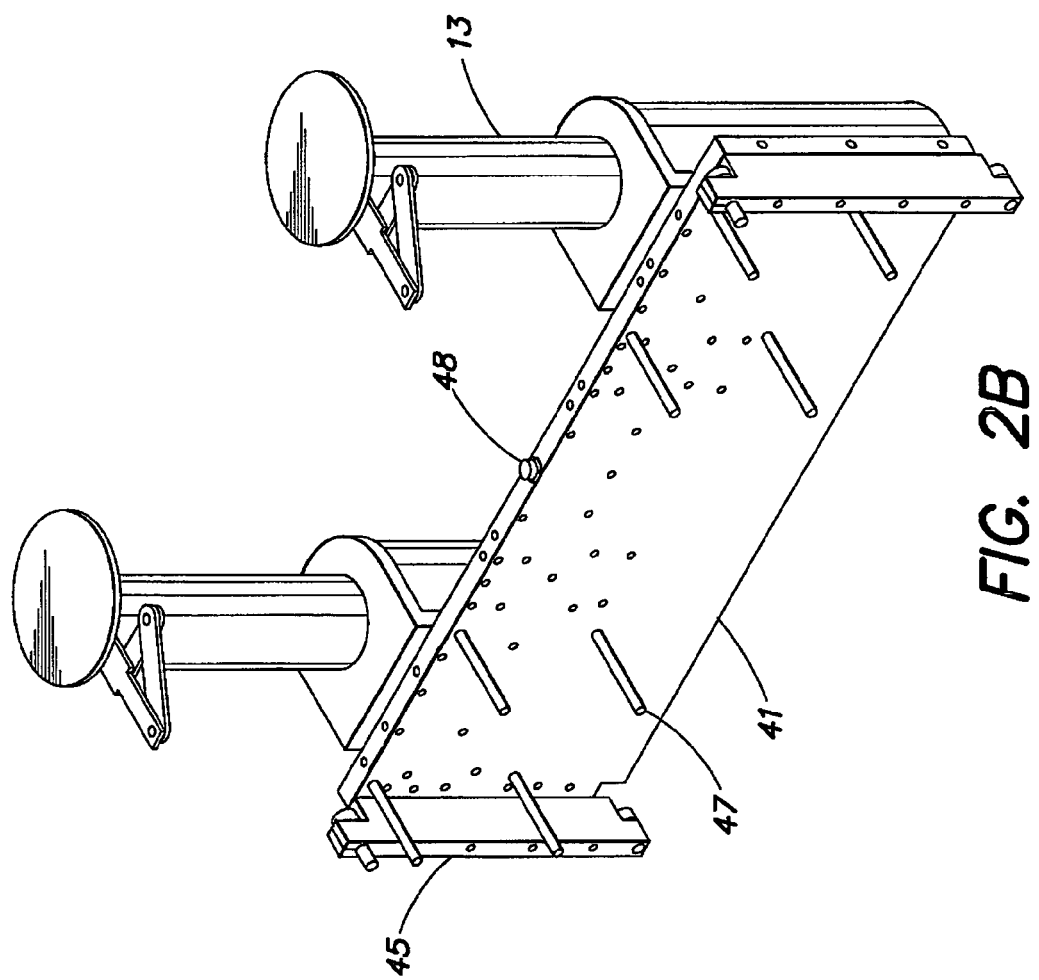

DATUM PLATE FOR USE IN INSTALLATIONS OF SUBSTRATE HANDLING SYSTEMS

This application is a continuation of U.S. patent application Ser. No. 10/186,256 filed Jun. 28, 2002 now abandoned which claims priority from U.S. Provisional Patent Application Ser. No. 60/302,114, filed Jun. 30, 2001. The contents of each of the above applications are hereby incorporated by reference herein in their entirety.

FIELD OF THE INVENTION

The invention relates generally to fabrication systems and more particularly to an apparatus and method for installing and aligning various components of a substrate handling and/or processing system.

BACKGROUND OF THE INVENTION

Conventional semiconductor fabrication systems transport a plurality of substrates in a sealed substrate carrier such as a sealed container or pod, thereby maintaining the substrates in a clean/controlled environment. Thus, conventional processing systems include one or more automatic door opener stations where sealed pods are opened, substrates are extracted therefrom and are loaded into the processing system. Typically each automatic door opener station comprises a docking platform adapted to receive a sealed pod which contains a plurality of substrates, and a pod door receiver adapted to engage and unlatch a door portion of the pod (hereinafter a pod door).

In operation, the docking platform receives a pod and moves the pod horizontally toward the pod door receiver. Thereafter, the pod door receiver engages and unlatches the pod door, moves the pod door horizontally away from the docking platform, and then moves the pod door vertically downward to provide clear access to the substrates in the pod.

Although automatic door openers generally provide reliable door opening, they typically require long installation and set up procedures. Accordingly a method and apparatus for facilitating automatic door opener installation and operation is needed.

SUMMARY OF THE INVENTION

In a first aspect, a datum plate is provided for use in installations of substrate handling systems. The datum plate has a set of predetermined attachment locations adapted to couple the datum plate to a chamber; a set of predetermined attachment locations adapted to couple one or more automatic door opener platforms to the datum plate; and a set of predetermined attachment locations adapted to couple one or more substrate handlers contained within the chamber, to the datum plate. The attachment locations are positioned such that when the datum plate is coupled to the chamber, and the automatic door opener platform and the substrate handler are coupled to the datum plate, the substrate handler and automatic door opener platform are aligned for substrate transfer therebetween. Other apparatuses such as substrate storage locations, automation modules, substrate carrier handlers and/or shelves for storing substrate carriers may also be coupled to the datum plate, via sets of predetermined attachment locations. A substrate handling system that employs the datum plate, and a method for installing the substrate handling system are also provided. In one aspect the inventive datum plate may be coupled to a supporting frame rather than to a chamber. Numerous other aspects are provided.

Further features and advantages of the present invention will become more fully apparent from the following detailed description of exemplary embodiments, the appended claims and the accompanying drawings.

BRIEF DESCRIPTION OF THE DRAWINGS

FIG. 2B is an isometric view of the datum plate taken from the automatic door opener side thereof showing factory interface substrate handlers coupled thereto;

DETAILED DESCRIPTION

Single Datum Plane System Installation

Figure 1:
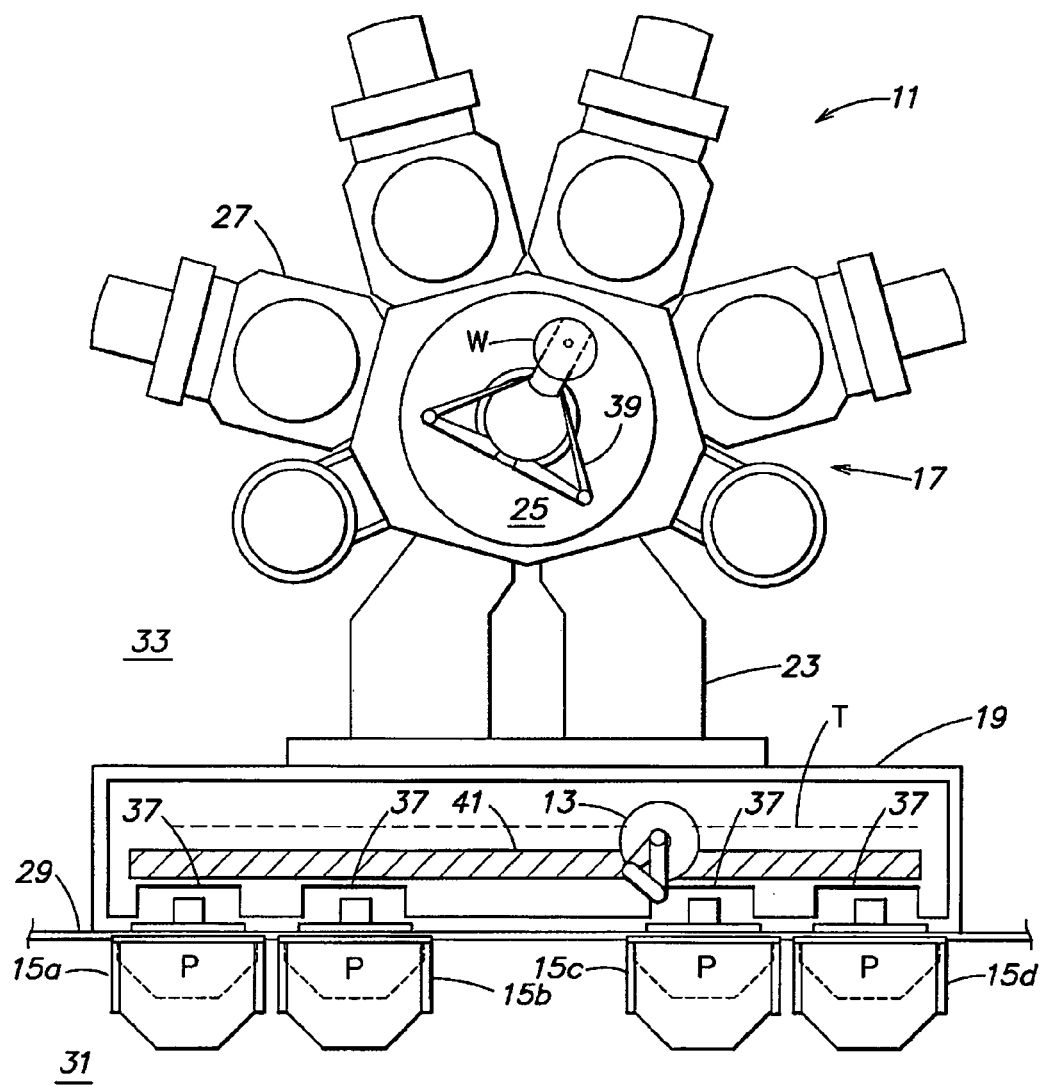
FIG. 1 a systematic top plan view, in pertinent part, of a processing system having a factory interface substrate handler adapted to transport substrates between a plurality of automatic door opener stations and a processing tool.

FIG. 1 is a schematic top plan view, in pertinent part, of a processing system 11 having a pair of factory interface substrate handlers 13 adapted to transport substrates between a plurality of automatic door opener stations 15a-d and a processing tool 17. The exemplary processing system 11 shown in FIG. 1 includes an interface chamber 19 and a processing tool 17 which, in this example, comprises a pair of loadlock chambers 23, a transfer chamber 25 coupled to the loadlock chambers 23, and a plurality of processing chambers 27 coupled to the transfer chamber 25.

An interface wall 29 is positioned between the automatic door opener stations 15a-d and the processing system 11 for separating a "white area" clean room 31 from a less clean, "gray area" clean room 33. The automatic door opener stations 15a-d are located in the "white area" clean room 31 and the processing system 11 is located in the less clean, "gray area" clean room 33. The automatic door opener stations 15a-d are positioned adjacent pod access openings 35 in the interface wall 29. The automatic door opener stations 15a-d comprise a docking platform P adapted to receive a sealed pod (not shown) and a pod door receiver 37 adapted to engage and unlatched a pod door from the remainder of the pod. The docking platform P is located on the white area side of the pod access opening 35 and the pod door receiver 37 is mounted on the grey area side of the pod access opening 35.

As previously stated, the interface chamber 19 contains one or more interface substrate handlers 13 adapted to extract substrates from an open pod positioned on the docking platform P and transport them to the loadlocks 23. The transfer chamber 25 of the processing tool 17 contains a transfer substrate handler 39 adapted to transport substrates W between the loadlock chambers 23 and the processing chambers 27. Note that a portion of the interface wall 29 located between the plurality of automatic door opener stations 15a-d and the interface chamber 19, has openings (not shown) therein to allow the docking platform P of the automatic door opener stations 15a-d to be coupled to a datum plate 41. Alternatively, the factory interface chamber 19 itself may act as the interface wall 29, and the interface wall 29 may be omitted.

As best shown in the views of FIGS. 2A-E, the docking platform P and the pod door receiver 37 of the automatic door openers 15a-d, and the interface chamber 19 (which supports the datum plate 41) are each coupled to the datum plate 41. Thus the datum plate 41 provides a single frame of reference for each of these components, allowing them to be installed with reference only to the datum plate 41 and leveled and adjusted as a unit. The datum plate 41 may include pre-machined references, alignment pins, guides or attachment locations (for example predrilled openings) to allow the automatic door openers 15a-d, the interface substrate handlers 13, as well as the interface chamber 19 to be coupled thereto at predetermined locations (enabling these components to be fixed in all of the x, y and z axes). Thus the inventive system may be installed quickly and easily, and with components more precisely positioned relative to each other, such that substrate hand-off operations may be more reliable.

Figure 2A:
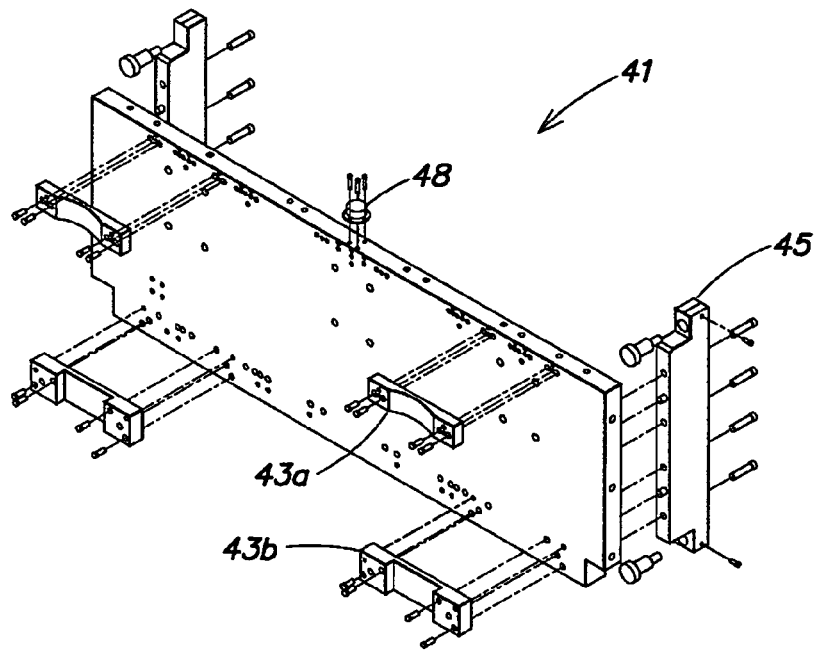
FIG. 2A is an exploded isometric view of the datum plate 41 taken from the factory interface side thereof.

The function of the datum plate 41 may be more fully understood with reference to FIGS. 2A-E. FIG. 2A is an isometric view of the datum plate 41 taken from the factory interface 19 side thereof. As shown in FIG. 2A, substrate handler mounting blocks 43a-b are adapted to couple the factory interface substrate handlers 13 to the datum plate 41 and have holes drilled therethrough that correspond to predrilled holes on the datum plate 41 to allow the mounting blocks 43a-b, and thus the factory interface substrate handlers 13, to be coupled to the datum plate 41 at predetermined locations and orientations, as shown in the isometric view of FIG. 2B, which is taken from the automatic door opener side of the datum plate 41.

Figure 2C:
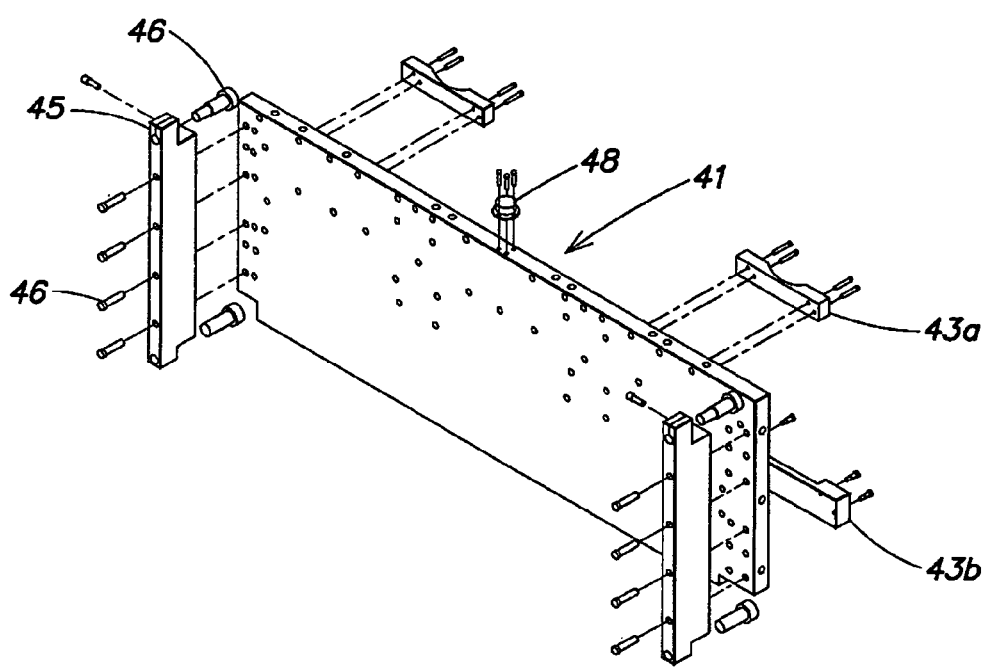
FIG. 2C is an exploded isometric view of the datum plate taken from the automatic door opener side thereof.

FIG. 2C is an isometric view of the datum plate 41 taken from the automatic door opener side thereof. As shown in FIG. 2C, factory interface mounting blocks 45 are adapted to couple the datum plate 41 to the frame of the factory interface chamber 19 and have holes drilled therethrough that correspond to predrilled holes on the datum plate 41 which allow the mounting blocks 45 to be coupled to the datum plate 41 at predetermined locations and with predetermined orientations. Thus, the datum plate 41 may be coupled to the frame of the factory interface chamber 19 via bolts 46 (or similar securing mechanisms that extend through the factory interface mounting blocks 45, through the datum plate 41 and into the factory interface chamber 19's frame (e.g., via predrilled mounting holes on the factory interface chamber's frame)) as shown in the isometric view of FIG. 2D which is taken from the automatic door opener side thereof. As will be apparent, the bolts 46 may be inserted from either the factory interface side, or from the automatic door opener side.

Figure 2D:
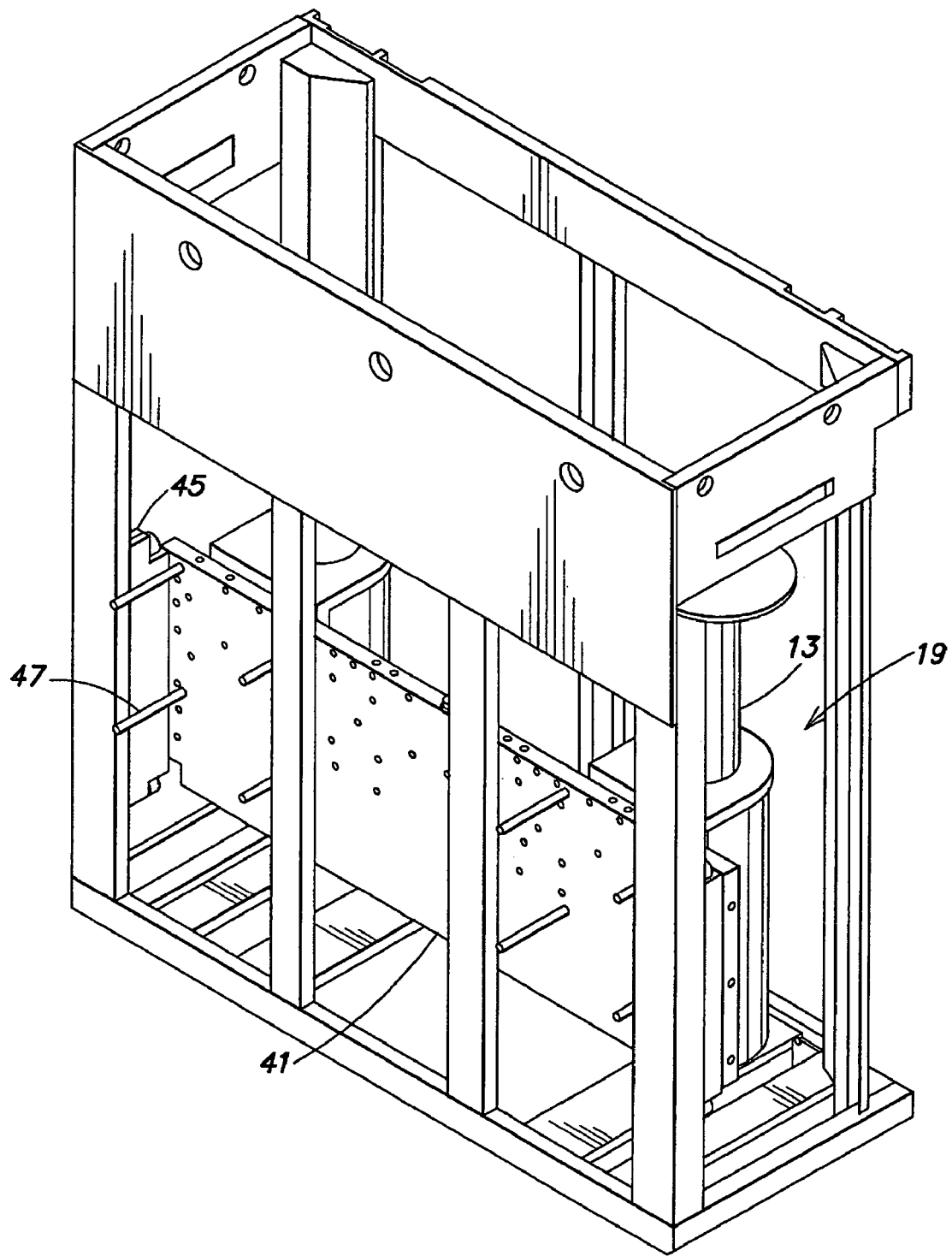
FIG. 2D is an isometric view of the frame of the factory interface chamber showing the datum plate coupled thereto.
Figure 2E:
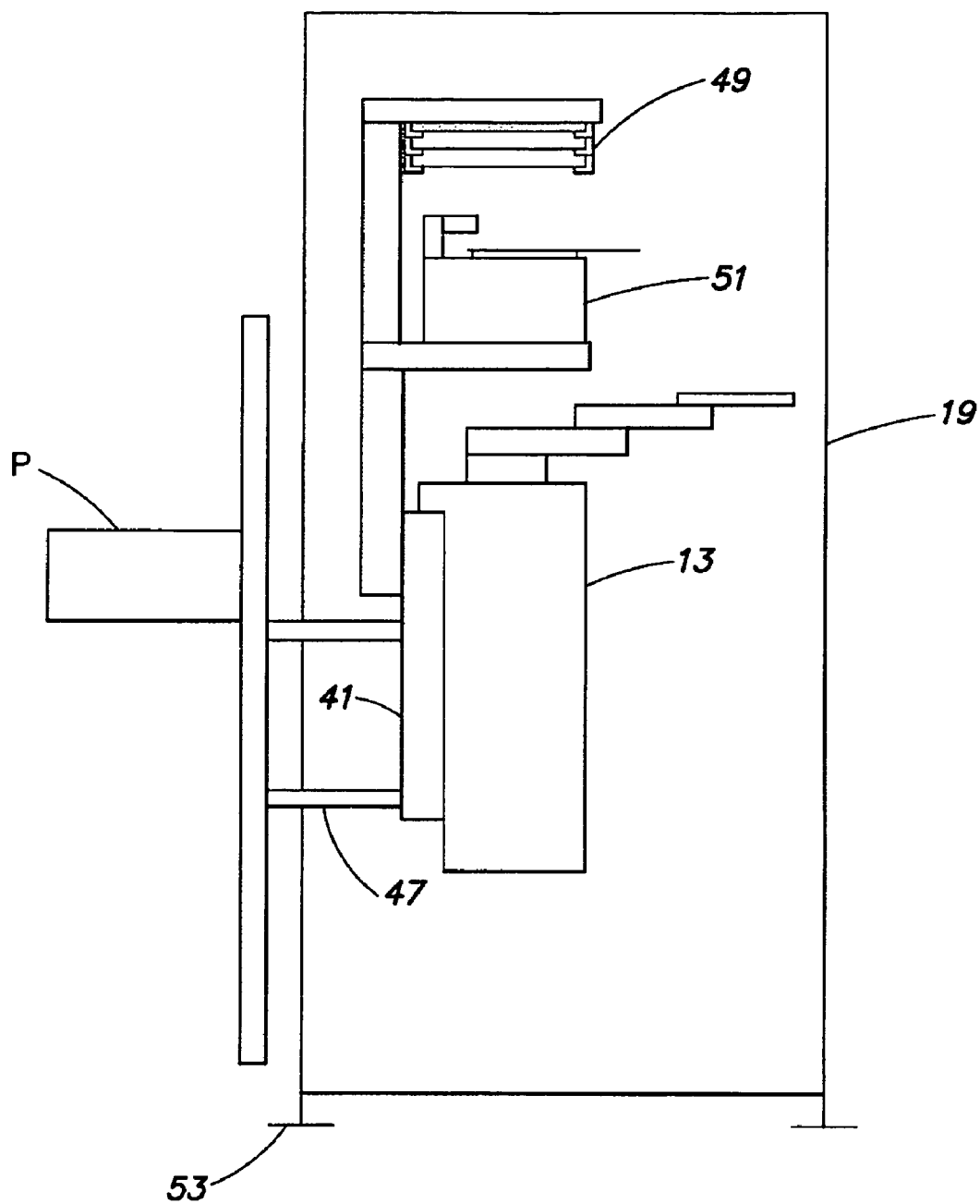
FIG. 2E is a schematic side elevational view of the datum plate, shown coupled to various components of the processing system.

As shown in both FIGS. 2B and 2D, automatic door opener posts 47 extend from the automatic door opener side of the datum plate 41 a sufficient distance such that they extend through the interface wall 29 (FIG. 1) to couple to predetermined locations (e.g., predrilled holes, not shown) on the front face of the automatic door opener 15's frame and to thereby support the automatic door opener 15, as best shown in the schematic side elevational view of FIG. 2E. As shown in FIGS. 2A-C the datum plate 41 may have an integrated level finder 48, such as a conventional liquid level finder.

FIG. 2E schematically shows the various components which may couple to the datum plate 41, including an optional substrate storage location 49 and an optional automation module 51. The optional automation module 51 may comprise a substrate orienter, centerfinder, ID reader, or a metrology/inspection station.

To install and align the components shown in FIGS. 2A-E, the factory interface chamber 19 is first provided. The datum plate 41 is coupled (e.g., bolted) to the factory interface chamber 19 via the mounting brackets 45 (FIGS. 2A-C), and is leveled by adjusting the factory interface chamber's mounting feet 53 while referring to the integrated level finder 48 (FIGS. 2A-C). Thereafter, the remaining components may be added in any order. Because each component is coupled to the datum plate 41 via predefined mounting locations/alignment posts, etc., each component is inherently leveled via its support by the datum plate 41. Further, aside from being leveled, each component occupies a specific position relative to each other component via its coupling to the datum plate 41's predetermined mounting locations.

Figure 2F:
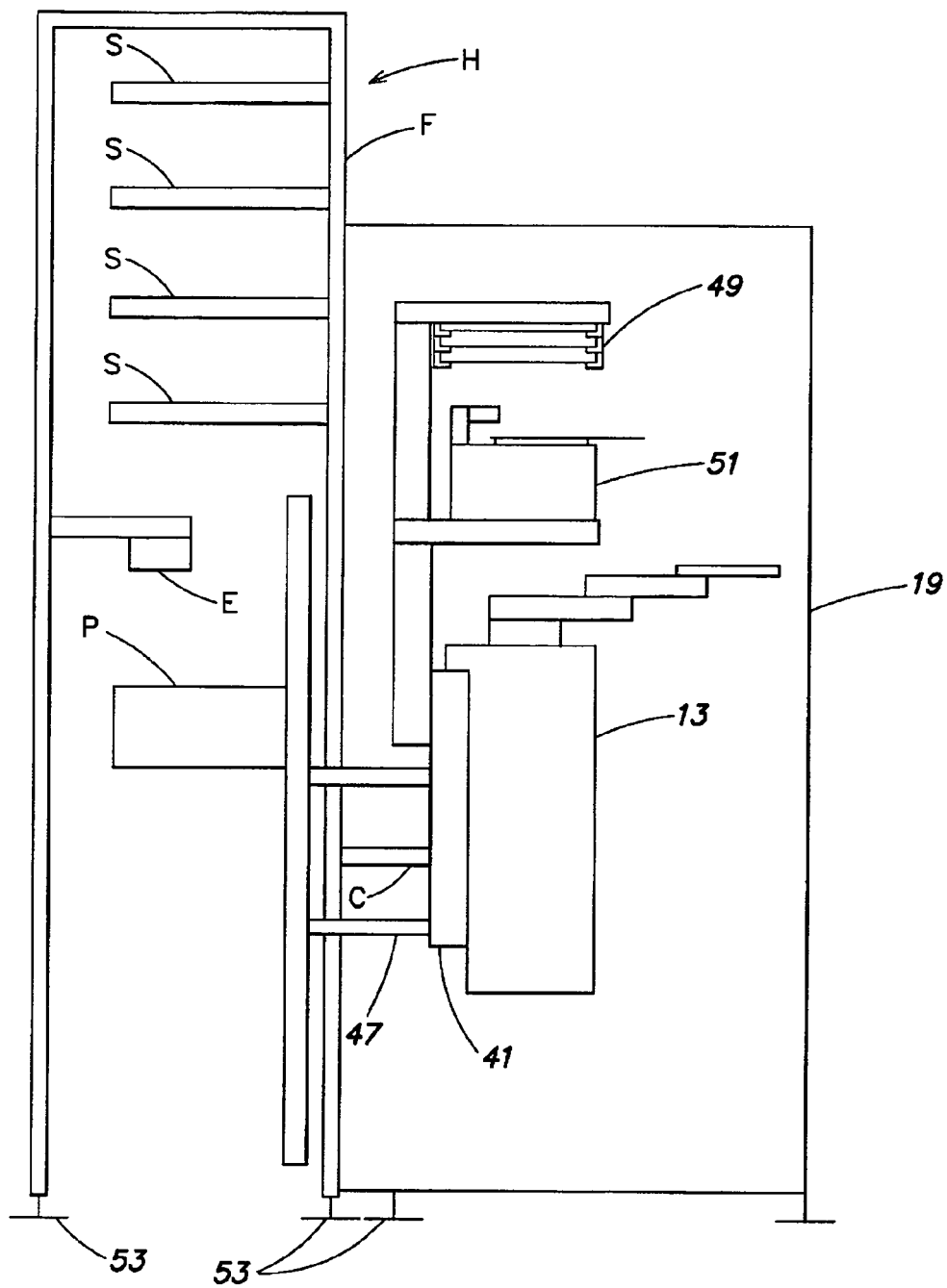
FIG. 2F is a schematic side elevational view of the datum plate, shown coupled to various components of the processing system, and to one or more storage shelves positioned above the automatic door opener.

Also, a support frame F having one or more pod storage shelves S coupled thereto may be coupled to the datum plate 41, as shown in FIG. 2F. A substrate carrier handler H may also be coupled to the frame F, and may be adapted to move substrate carriers among the plurality of pod storage shelves S, and the one or more docking platforms P. The substrate carrier handler H may comprise a vertical and horizontal linear guide (not shown) movably coupled to the frame F, and an end effector E coupled to the vertical or horizontal linear guide. An apparatus for providing storage shelves above an automatic door opener is disclosed in U.S. patent application Ser. No. 09/201,737, filed Dec. 1, 1998, the entire disclosure of which is incorporated herein by this reference. The shelves, and/or the substrate carrier handler of the '737 apparatus may be coupled directly to the datum plate 41, or coupled thereto via the frame F such that the storage apparatus and the various components of the processing equipment may be more quickly and accurately aligned.

In one aspect, the projected floor space occupied by the shelves S and the portion of the automatic door opener 15 located in the white area clean room 31 may be the same. That is, the portion of the automatic door opener 15 located in the white area clean room 31, and the pod storage shelves S may occupy the same footprint.

The support frame F may be supported via leveling feet 53 (like those that support the interface chamber 19) and coupled to the datum plate 41 (e.g., via coupling mechanism C) for alignment therewith. As will be apparent, coupling mechanism C may be a strut, bolt, or any similar mechanism adapted to ensure location in the X, Y and Z planes.

As used herein the term "plate" is not to be limited to any particular shape or configuration, but is to be interpreted broadly to cover any structure that provides predetermined mounting locations, and functions as a datum point or plane, allowing coupling of the specified components in predetermined positions relative to each other.

Similarly, predetermined mounting or attachment locations may be areas that are marked for drilling, or may be areas that are predrilled and/or have additional mounting mechanisms (brackets, bolts, screws, struts, etc.) coupled thereto.

The datum plate may be coupled to any supporting structure (a chamber, a frame, etc.) or may be free standing in which case the datum plate may have adjustable leveling feet.

Note that the automatic door opener described herein is merely exemplary. The inventive datum plate and installation method may be employed with any automatic door opener, regardless of the mechanism employed for door opening. Specifically, when an automatic door opener platform (e.g., any mechanism that holds a sealed or closed wafer carrier adjacent an opening mechanism) is coupled to the inventive datum plate, and a substrate handler for extracting a substrate from the opened substrate carrier is coupled to the inventive datum plate, the substrate handler will be properly aligned for substrate transfer to/from the opened substrate carrier. Thus, the inventive apparatus and method may be used advantageously with any automatic door opener.

With use of the inventive datum plate and installation method, substrate and/or substrate carrier transfer between the various components coupled to the datum plate is facilitated as the datum plate's attachment/mounting locations are positioned such that when the various components are coupled to the datum plate, the various components are aligned for transfer of substrates or substrate carriers therebetween.

Programmable Docking Platform Speed and Position Relative to Interface Wall

Figure 3A:
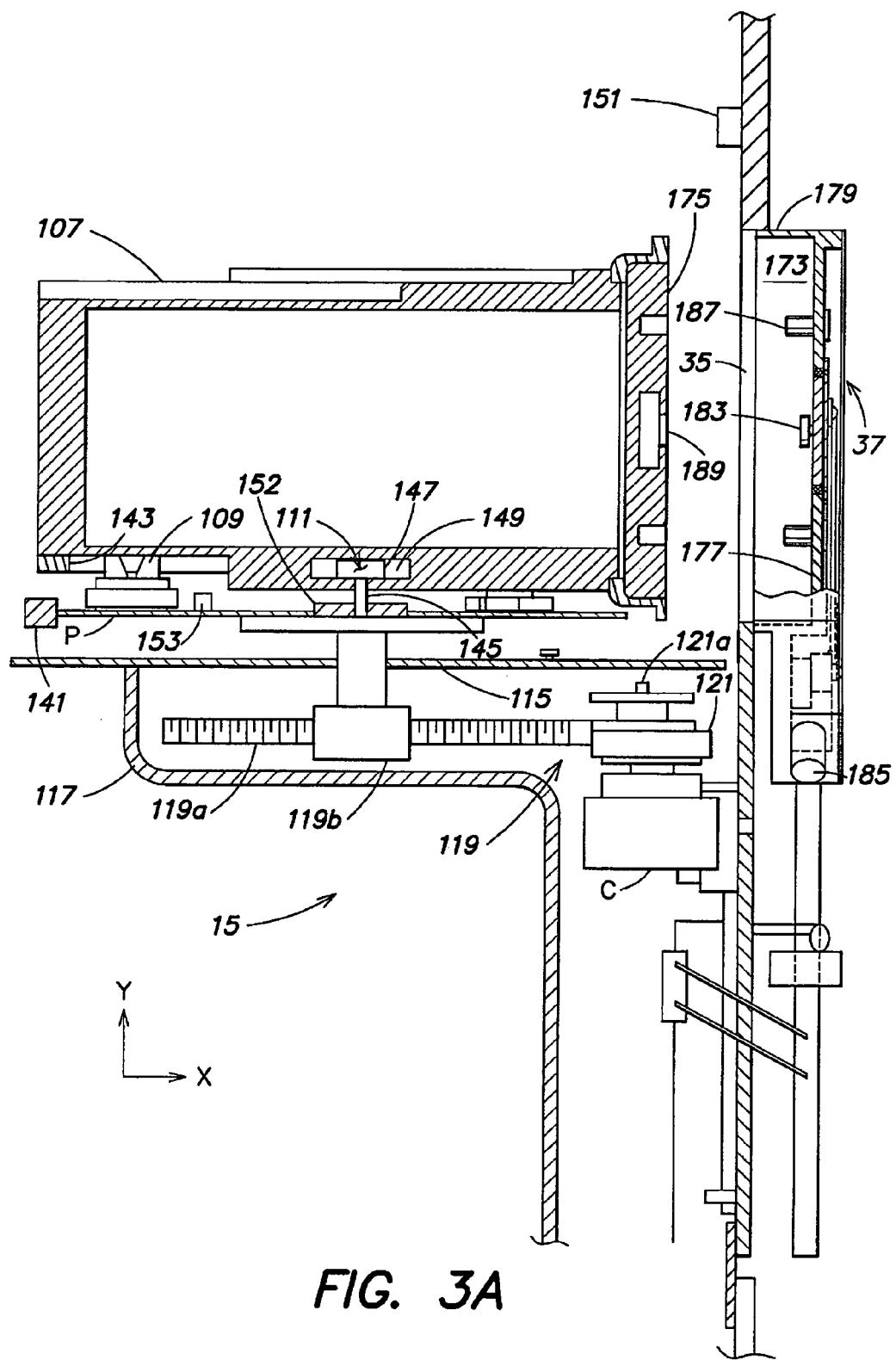
FIGS. 3A-B are side cross-sectional views of an inventive automatic door opener, shown in a pod exchange position, and a docked position respectively.
Figure 3B:
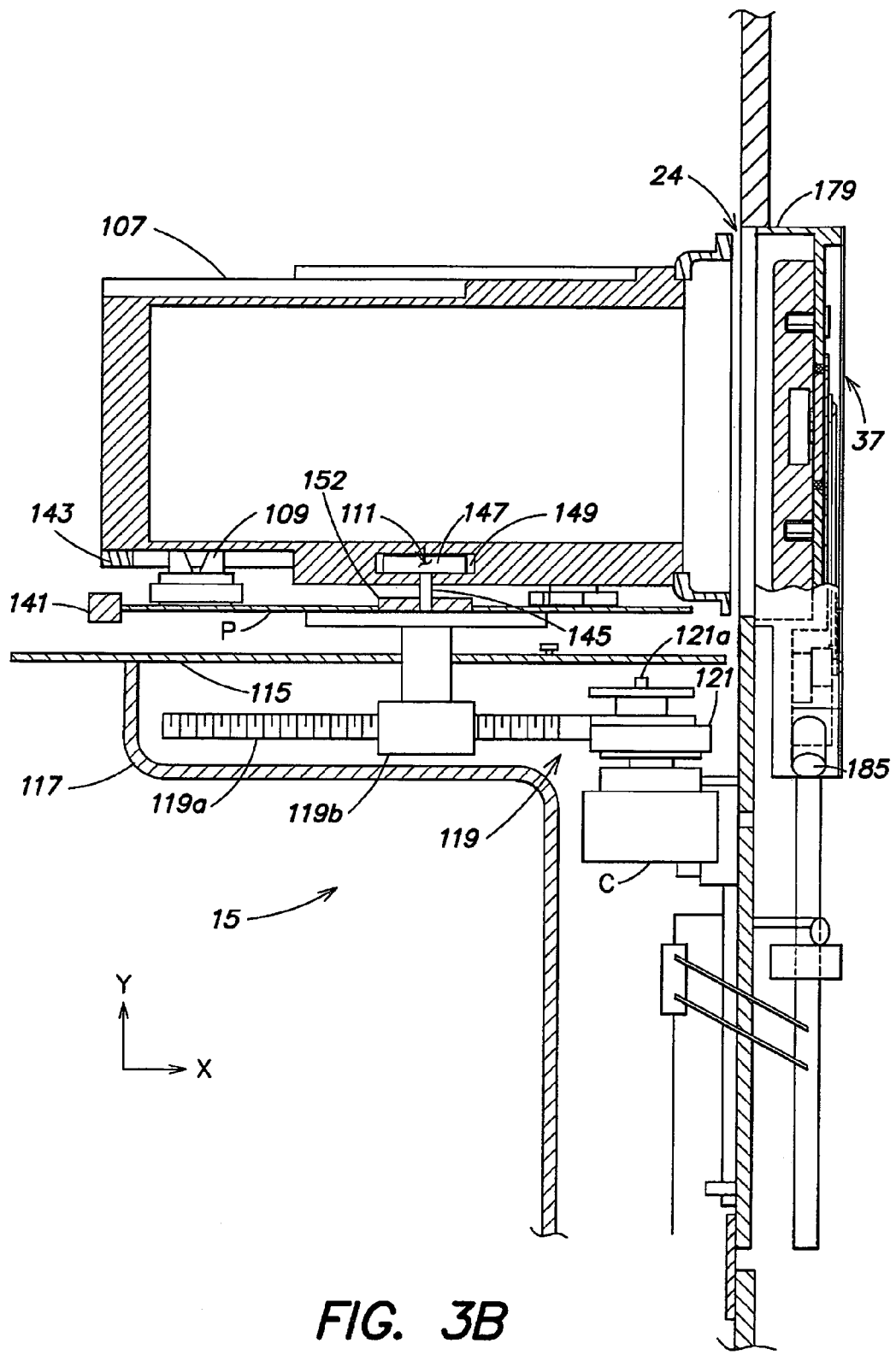
Figure 3C:
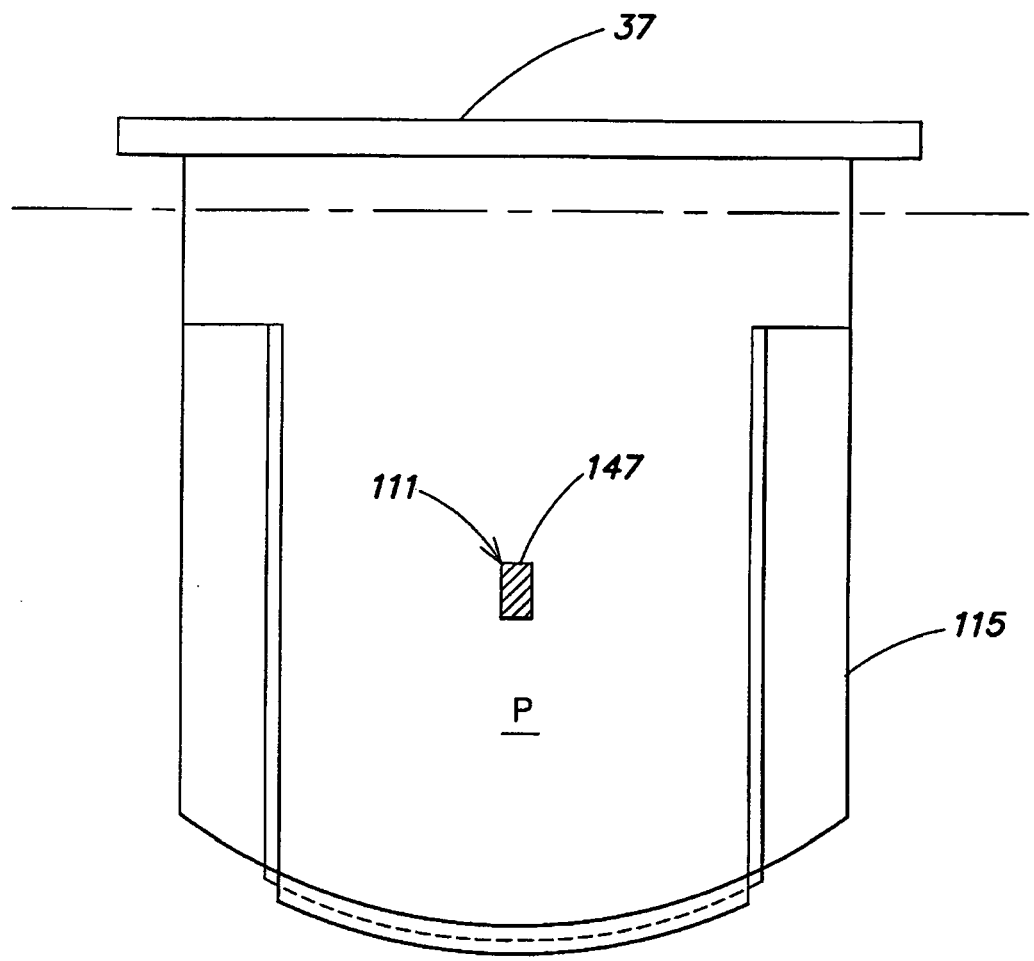
FIG. 3C is a top plan view of the inventive door opener.

FIGS. 3A-B are side cross-sectional views of an inventive automatic door opener station 15. The inventive automatic door opener station 15 comprises a docking platform P and a pod door receiver 37. A pod 107 is shown positioned on alignment pins 109 which are connected to the docking platform P. A pod clamp 111 coupled to the docking platform P secures the aligned pod 107 in place on the docking platform P. The docking platform P is translatably mounted (via a horizontal actuator 119) to a base plate 115 which supports the docking platform P. An enclosure wall 117 encloses the horizontal actuator 119. In the exemplary embodiment shown in FIG. 3, the horizontal actuator 119 comprises a lead screw 119*a* having a fitting 119*b* movably mounted thereto. The pod platform P fixedly mounts to the fitting 119*b* and translates therewith along the lead screw 119*a*.

A servo motor 121 (having an encoder 121*a*) is coupled to the lead screw 119*a* so as to rotate the same, causing the fitting 119*b* to move therealong. Specifically, the encoder 121*a* is coupled to the servo motor 121 and to a controller C. As is known in the art, the controller C provides to the encoder 121*a* a desired distance (e.g., a number of steps) and a direction the servo motor 121 is to travel. The encoder 121*a* then converts the distance/direction signals into appropriate current/voltage signals and drives the servo motor therewith. The controller C also may receive feedback information from the servo motor 121 (directly or via the encoder 121*a*) regarding the rotational resistance exhibited by the lead screw 119*a* (e.g., a current signal representative of the amount of torque applied to the lead screw 119*a*). In this manner, when the docking platform P (or a pod 107 positioned thereon) contacts the pod door receiver 37, or any undesirable obstruction, the lead screw 119*a*'s resistance to rotation will increase and the controller C may use this information to control continued forward or backward motion of the docking platform.

In accordance with the present invention, computer program code (e.g., one or more computer program products) is provided that allows the controller C to control the servo motor 121 such that:

(1) the docking platform P moves at a slower speed during certain portions of its movement, such as while a pod positioned on the docking platform P contacts a surface surrounding the pod access port 35; and/or (2) the docking platform P (and/or a pod disposed thereon) is spaced from a surface surrounding the pod access port 35 when the docking platform P reaches its final position (e.g., so that a gap 24 shown in FIG. 3B exists therebetween).

Option (2) may be accomplished, for example, by having the docking platform P contact the pod access port 35's surrounding surface (e.g., as detected by an increase in rotational resistance of the lead screw 119*b*) and by then directing the servo motor 121 to "step back" by a predetermined distance so that a repeatable/predetermined gap 24 remains between the docking platform P (and/or the pod disposed thereon) and the surface surrounding the pod access port 23. The step back may occur after the pod door has been removed.

Pod ID Reader Mounted to Move with Docking Platform

Mounted on the docking platform P is an ID reader 141, mounted in a position with respect to the alignment pins 109 so as to allow the ID reader 141 to read the identification tag 143 of a pod 107 positioned on the docking platform P. Because the ID reader 141 is mounted to the docking platform P, the ID reader 141 travels with the docking platform P as the docking platform P moves between the pod exchange position (see FIG. 3A) and the docked position, adjacent the pod access port 35 (see FIG. 3B). Accordingly the inventive automatic door opener 15 may read a pod ID code 143 when a pod 107 is in the carrier exchange position (FIG. 3A), the docked position (FIG. 3B) or any position therebetween. A pod 107 properly positioned on the docking platform P (e.g. via the alignment pins 109) may be identified at any time by the ID reader 141.

Rotatable/Retractable Pod Clamp

Also coupled to the docking platform P so as to move therewith, is a clamp 111 which secures the aligned pod 107 in place on the docking platform P. The clamp 111 comprises a post 145 having an elongated head portion 147, as best seen from the top plan view of FIG. 3C. The clamp 111's size and location relative to the alignment pins 109 is such that the clamp 111, when in an initial, un-actuated position, will enter a corresponding opening 149 on the bottom of a standard pod 107 positioned on the alignment pins 109. The clamp 111 is further coupled to an actuator 152 adapted to rotate and retract the clamp 111. Rotation of the clamp 111 prevents the pod 107 from moving in the X-direction (see FIG. 3A). Retraction of the clamp 111 (see FIG. 3B) may more firmly hold the pod 107 in place and may prevent rocking, tilting or movement of the pod 107 in any direction.

Pod Present Sensor

Another feature found on the docking platform P side of the inventive automatic door opener 15 is a pod present detector (shown in FIGS. 3A-B) comprising a light emitter 151 such as an LED, and a light detector 153 such as photodetector. The light emitter 151 may be coupled to an upper portion of the pod door opener's frame and may be positioned such that the beam of light emitted therefrom is directed across the vicinity of the docking platform P, to the light detector 153 which may be coupled to the docking platform P. The light emitter 151 and detector 153 are arrange such that the beam of light emitted by the emitter 151 is detected by the detector 153 unless a pod 107 or some other obstruction is present in the vicinity of the docking platform P. Accordingly when the detector 153 does not detect the emitted beam of light, the detector 153 sends a carrier present signal to a controller C coupled thereto. Note, in the exemplary embodiment shown, the controller C may control the operation of all the automatic door opener's sensors and moving parts.

Retractable Pod Door Receiver Keys

Specific features relating to the pod door receiver 37 side of the inventive automatic door opener 15 will now be described. As shown, the pod door receiver 37 defines a recess 173 into which a pod door 175 may be received. The recess 173 may be defined by a plate 177 and walls 179. The plate 177 of the recess 173 may include a pod door key actuating mechanism which comprises a key 183 and a pneumatic actuator 185 coupled to the key 183 and adapted to rotate the key 183 so as to unlatch the pod door 175 from the remainder of the pod 107 and further adapted to retract the rotated key 183 so as to support the pod door 175. Alignment pins 187 may also be provided on the plate 177 for aligning the pod door 175 with the pod door receiver 37 such that the pod door receiver key 183 enters a corresponding key hole 189 on the pod door 175 of a standard pod 107.

Pod Door Receiver Key Design

Figure 4A:
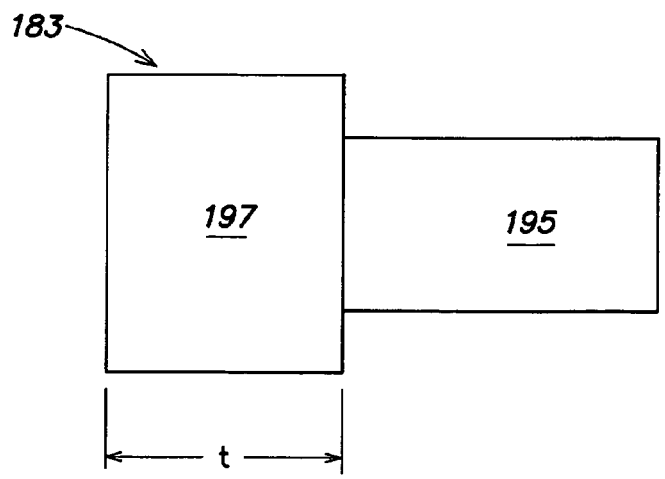
FIGS. 4A-C are schematic side views of a conventional pod door opener key, and two alternative embodiments of an inventive key, respectively.
Figure 4B:
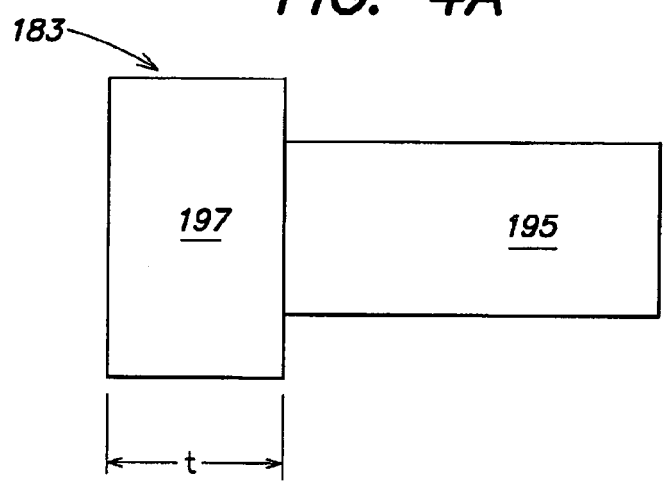
Figure 4C:
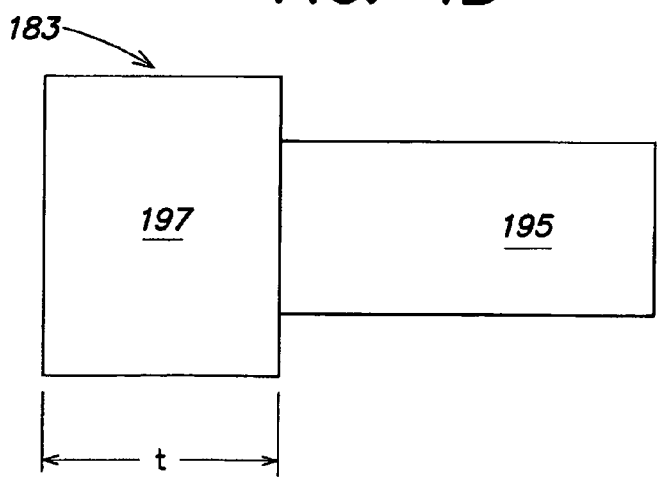

Like the clamp 111, the pod door receiver key 183 comprises a base portion 195, and an elongated head portion 197 coupled thereto (as best seen with reference to FIGS. 4A-C). The present inventors believe that a source of failure of conventional pod door opener keys 183 has been the fact that the key heads 197 contact and rub against the interior surface of the pod door 175 during key rotation. Thus the present inventors believe that conventional keys generate particles that may cause subsequent key failure or that may contaminate substrates transferred via conventional automatic door openers.

Accordingly, the pod door key 183 of the inventive automatic door opener is designed such that the head portion 197 thereof will not contact the interior surface of the pod door 175. This may be achieved by reducing the thickness of the key head 197, or by lengthening the base portion 195 of the key. For example, when opening a standard pod 107, if the overall length of the key 183 is equal to the current SEMI (Semiconductor Equipment and Materials International) specification, the key head 197's thickness (represented by arrow t) should be less than the current SEMI specification therefore), as shown in FIG. 4B. Alternatively when opening a standard pod 107, if the head portion 197 of the pod door receiver key 183 is as thick as that specified in the current SEMI specifications, the overall length of the key 183 should be longer than the SEMI specification, as shown in FIG. 4C.

Surface Finish of Metal Parts

The present inventors further believe that conventional pod door failure and/or substrate contamination may result from the use of turned parts, as turning results in rough surface finishes. Accordingly, any of the inventive automatic door opener 15's metal parts may be polished mechanically or chemically so as to have a smooth surface finish. Particularly, the pod door receiver key 183 and alignment pins 187 may be polished, as may be the docking platform alignment pins 109 and clamp 111, etc.

Programmable Pod Door Receiver Retraction Speed

Another feature of the pod door receiver side of the inventive automatic door opener 15 is the controller C's ability to provide programmable pod door receiver retraction speed. Specifically, with reference to the front elevational view of the pod door receiver 37 shown in FIG. 5, a servo motor 186 is coupled to the pod door receiver 37, and the pod door receiver 37 and servo motor 186 are adapted such that the servo motor 186 can lift and lower the pod door receiver 37 between an elevated position wherein the pod door receiver 37 occludes the pod access opening 35 in the interface wall 29, and a lowered position wherein the pod door receiver 37 does not occlude the pod access opening 35 in the interface wall 29 (FIG. 1). The pod door receiver 37 may be guided via one or more guide rails 201.

Figure 5:
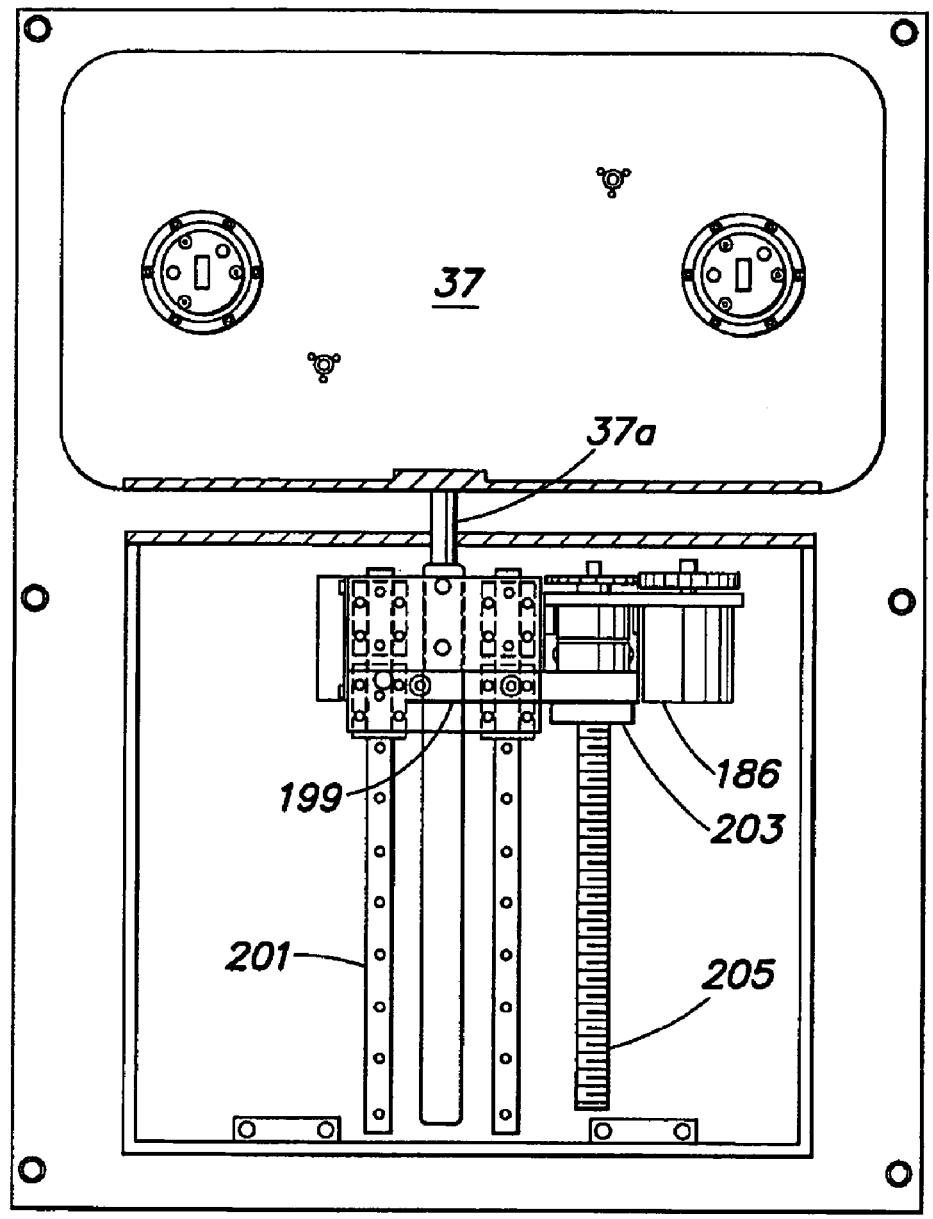
FIG. 5 is a front plan view of the pod door receiver.

As shown in the front plan view of FIG. 5, the pod door receiver 37 may have an extended portion 37a that is mounted to a bracket 199. The bracket 199 is slideably coupled between a pair of guide rails 201, and is fixedly coupled to a nut 203 that is mounted to a lead screw 205. The servo motor 186 is adapted to rotate the lead screws 205 causing the nut 203 to move up and down depending on the lead screw 205's direction of rotation. The servo motor 186 coupled to the pod door receiver 37 is further coupled to the programmable controller C (FIG. 3A), and the programmable controller C is programmed so as to allow a user to specify the speed at which pod door receiver 37 lifts and lowers. In one aspect the program allows the user to select a slower speed during certain portions of the pod door receiver's movement, and to select a faster speed during other portions of the pod door receiver's movement.

Single Actuation Dual Axis Motion Pod Door Receiver

The components of the automatic door opener 15 that control the retraction of the substrate carrier door receiver 37 are described with reference to the side elevational views of FIGS. 6A-C that sequentially show the operation of the pod door receiver.

The vertical motion of the pod door receiver 37 may be translated into horizontal motion (e.g., pod door receiver motion toward and away from the pod access opening 35 in the interface wall 29), as described in U.S. patent application No. 60/217,147 (AMAT 5183), filed Jul. 7, 2000, the entire disclosure of which is incorporated herein by this reference. Specifically, a vertical motion stop 211 may be adapted to stop the vertical motion of the pod door receiver 37, and a motion translator link 213 such as a four-bar link may be coupled to the vertical motion stop and to the pod door receiver 37, so as to move the pod door receiver 37 forward after the pod door receiver's vertical motion has been stopped via the vertical motion stop.

Figure 6C:
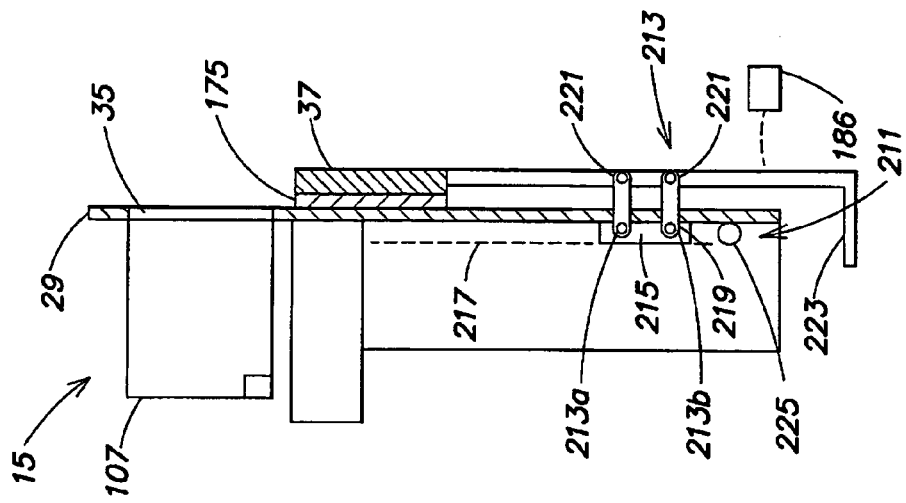
FIGS. 6A-C are schematic side elevational views of the automatic door opener sequentially showing the horizontal and vertical motion of the pod door receiver.
Figure 6B:
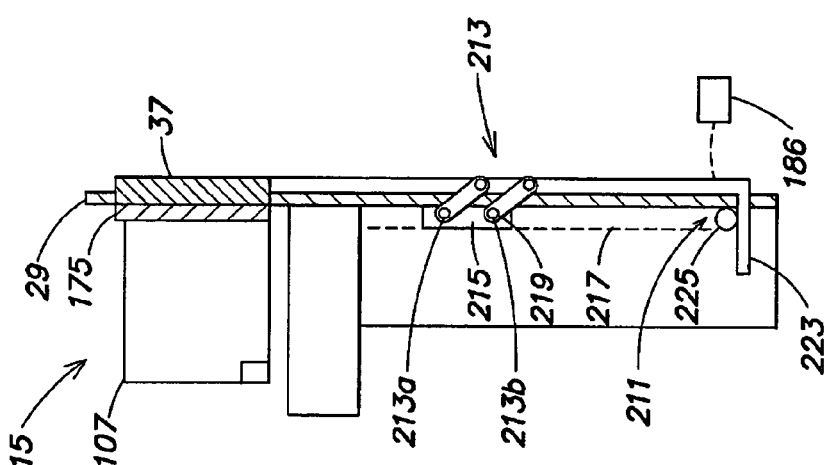
Figure 6A:
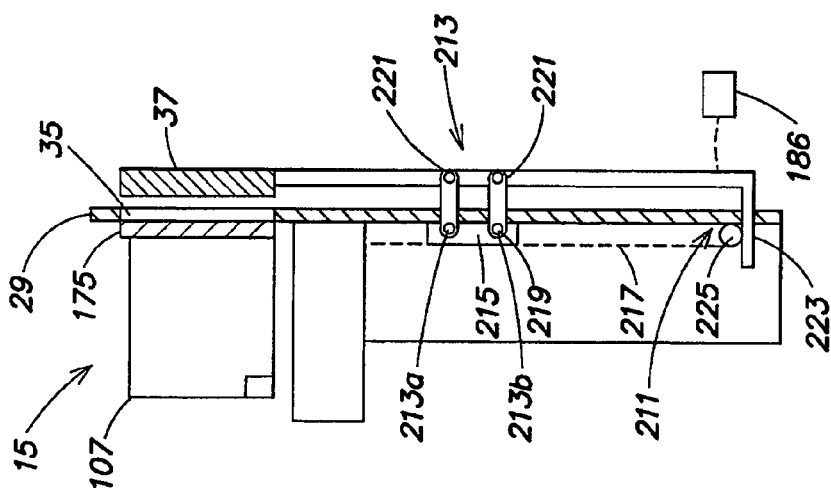

As shown in FIGS. 6A-C, the automatic door opener 15 comprises a horizontally stationary member 215 (e.g., a member fixed against horizontal motion via a track 217 which allows vertical motion of the horizontally stationary member 215 but which prohibits horizontal motion), and a link 213 coupled between a substrate carrier door receiver 37 and the horizontally stationary member 215, so as to allow vertical actuation to be translated into horizontal movement of the substrate carrier door receiver 37, as described below.

The link 213 may comprise an upper link 213a and a lower link 213b, both adapted to pivot between a retracted position (FIG. 6B) and an extended position (FIG. 6A). The upper link 213a comprises a first joint 219 and a second joint 221. The first joint 219 is coupled to the horizontally stationary member 215 and the second joint 221 is coupled to the substrate carrier door receiver 37. Similarly, the lower link 213b comprises a first joint 219 and a second joint 221, which also are coupled to the horizontally stationary member 215 and the substrate carrier door receiver 37, respectively. Thus, the substrate carrier door receiver 37, the horizontally stationary member 215, the upper link 213a, and the lower link 213b may be configured to comprise what is conventionally known as a four-bar link.

The automatic door opener 15's vertical motion stop 211 may comprise a cam follower 223 (such as a horizontal extension) coupled to the substrate carrier door receiver 37, so that the cam follower 223 moves both vertically and horizontally with the substrate carrier door receiver 37. The cam follower 223 is adapted so as to contact a vertically stationary mechanism (e.g., a cam 225) as the substrate carrier door receiver 37 moves vertically upward, thereby stopping further vertical motion of both the cam follower 223 and the substrate carrier door receiver 37.

The cam 225 is positioned such that when the cam follower 223 contacts the cam 225, the substrate carrier door receiver 37 is in position to engage (e.g., at the same elevation as) the pod access port 35 and the door 175 of the pod located on the docking platform P. The cam 225 and the docking platform P may serve as datum points so as to properly position the substrate carrier door receiver 37 relative to the pod door 175.

A counterbalancing mechanism such as a spring (not shown) adapted to bias the substrate carrier door receiver 37 upwardly, may also be employed.

The operation of the door receiver 37's motion translator is now described with reference to the sequential views of FIGS. 6A-C. The upper link 213a and the lower link 213b are initially in the extended position as shown in FIG. 6A. Because the horizontally stationary member 215 is positioned on the docking platform P side of the automatic door opener 15, the extended position pushes the substrate carrier door receiver 37 horizontally away from pod access port 35, as shown in FIG. 6A.

In operation, the actuator 186 moves the pod door receiver 37 vertically upward so as to place the pod door receiver 37 in position to engage the pod door 175. As the pod door receiver 37 moves vertically upward, the horizontally extending cam follower 223 contacts the cam 225 so as to prevent the cam follower 223 and the pod door receiver 37 from further moving vertically upward.

The horizontally stationary member 215 continues to move vertically upward relative to the cam follower 223 and the pod door receiver 37 both of which remain vertically stopped by the cam 225. As the horizontally stationary member 215 continues to move vertically upward, the first joints 219 of the upper link 213a and the lower link 213b move upward therewith. Because the horizontally stationary member 215 is restrained horizontally, this vertical motion positions the upper link 213a and the lower link 213b in the retracted position as shown in FIG. 6B, thereby retracting the pod door receiver 37 horizontally inward toward the pod access port 35. Because the horizontally stationary member 215 is positioned on the docking platform P side of the pod access port 35, the retracted position thus pulls the pod door receiver 37 toward the pod access port 35.

As the upper link 213a and the lower link 213b move to the retracted position, the cam follower 223 and the substrate carrier door receiver 37 coupled thereto, move horizontally in a straight line (e.g., due to the horizontally straight configuration of the cam follower 223 and the vertical fixation thereof when engaged with the cam 225) toward the pod access port 35 as shown in FIG. 6B, such that the pod door receiver may receive the pod door 175. Thereafter the sequence is reversed and the pod door receiver 37 lowers, carrying the pod door 175 therewith.

As is evident from the description above, the inventive pod door opener 15 may use a single actuator 186 to effect both vertical and horizontal movement of the pod door receiver 37.

Further, the cam 225 provides a convenient datum point that allows the position of the substrate carrier door receiver 37 to be accurately controlled relative to the pod access port 35. Additionally, the preferred straight-line motion (e.g., which may result the straight surface of the cam follower 223 following the cam 225) of the pod door receiver 37 may reduce particle generation that may otherwise occur when the pod door receiver 37 contacts the pod door 175.

Programmable FIMS Gap

Another feature found on the pod door receiver side of the inventive automatic door opener 15 is the ability to adjust the pod door receiver 37's protrusion from the surface of the interface wall 29 toward the docking platform P.

Specifically, the controller C which controls the servo motor 186 coupled to the pod door receiver can be programmed so as to stop the vertical motion of the horizontally stationary mechanism 215 at a predetermined position relative to the cam 225 which acts as a vertical motion stop. After the cam 225 is contacted, the farther the horizontally stationary mechanism 215 moves above the vertical motion stop (e.g., cam 225) the greater the horizontal distance the pod door receiver 37 moves toward the docking platform P.

Figure 7A:
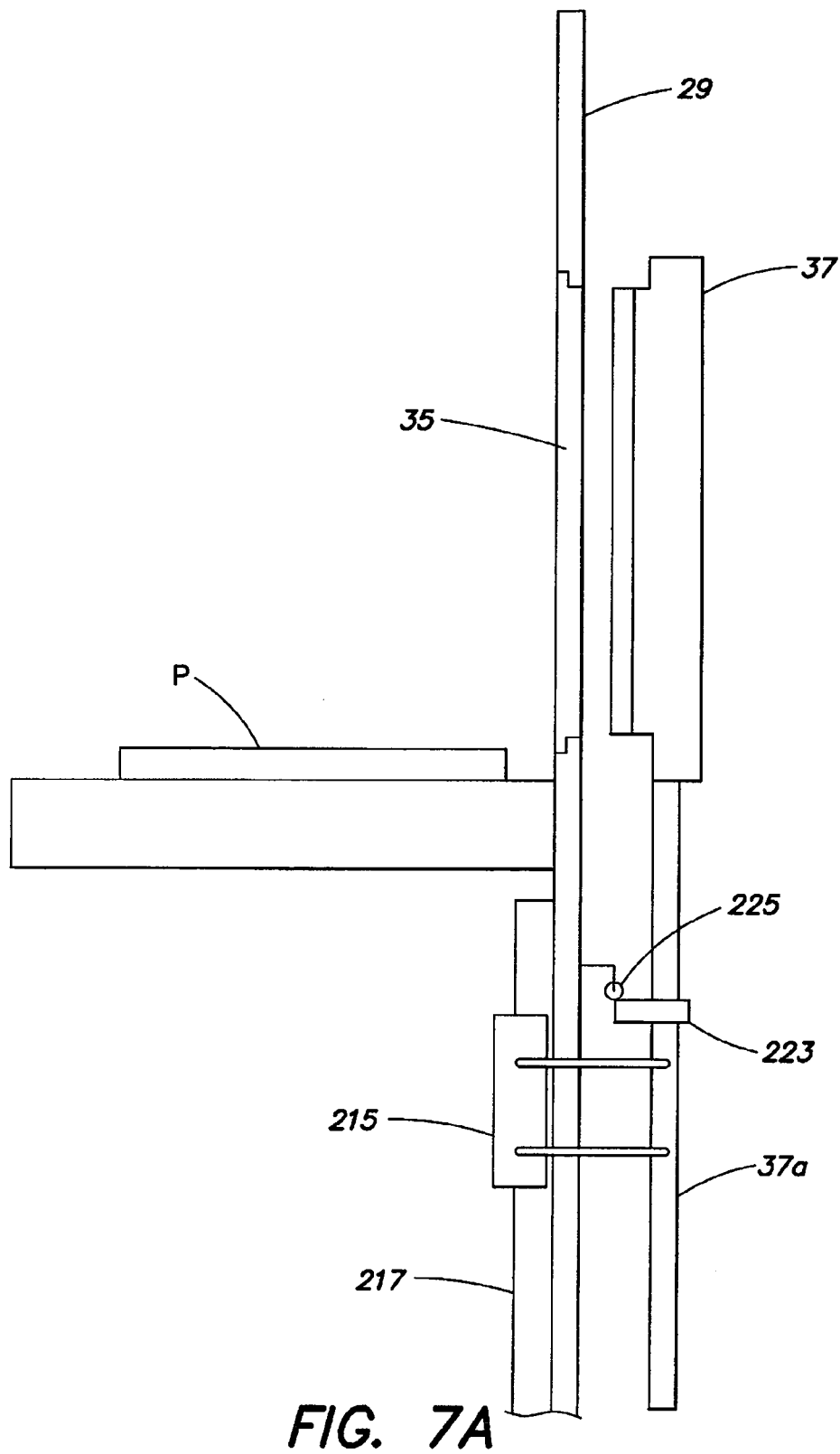
FIGS. 7A-C are schematic side elevational views showing the mechanism which controls the pod door receiver protrusion.
Figure 7B:
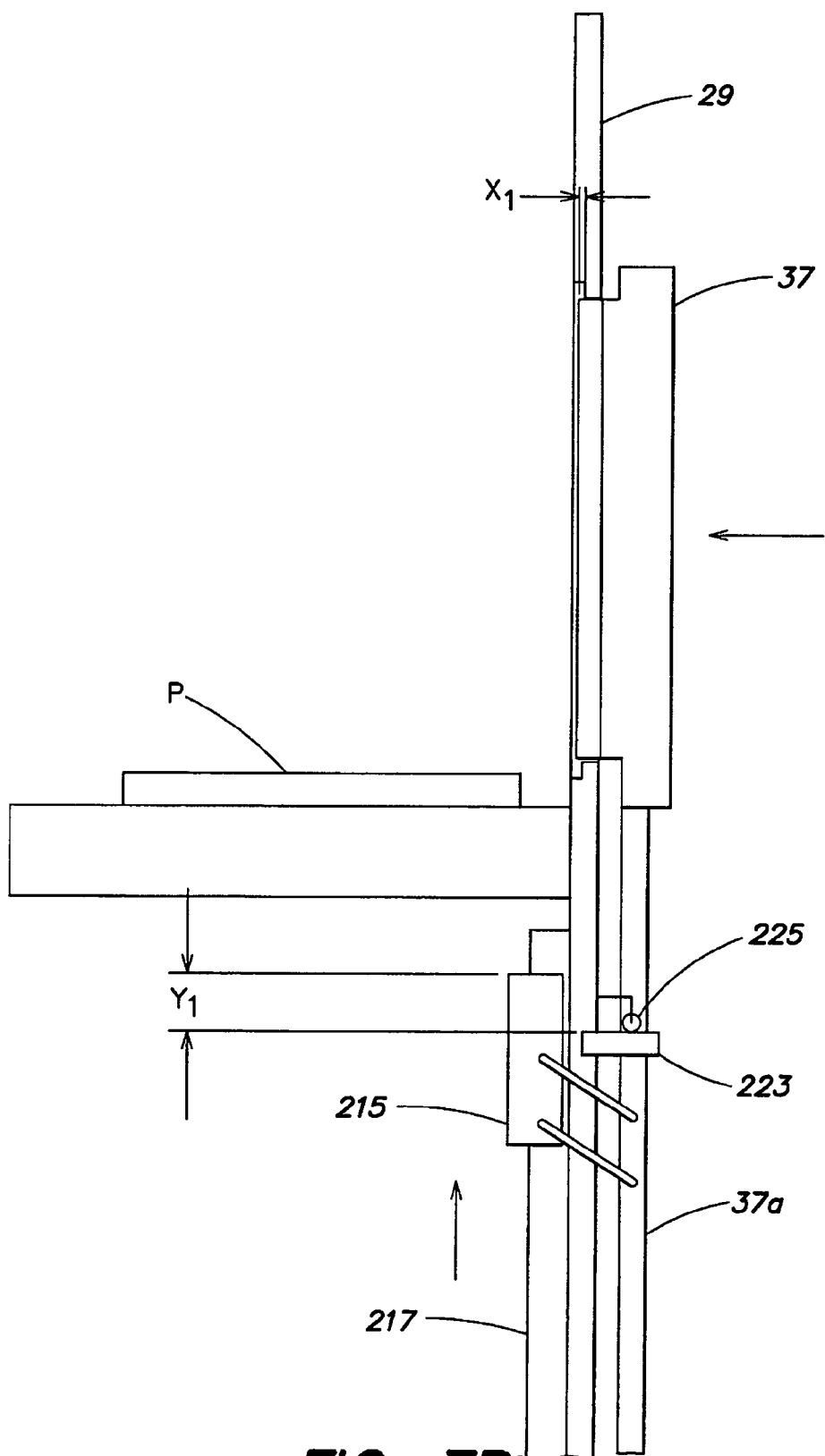
Figure 7C:
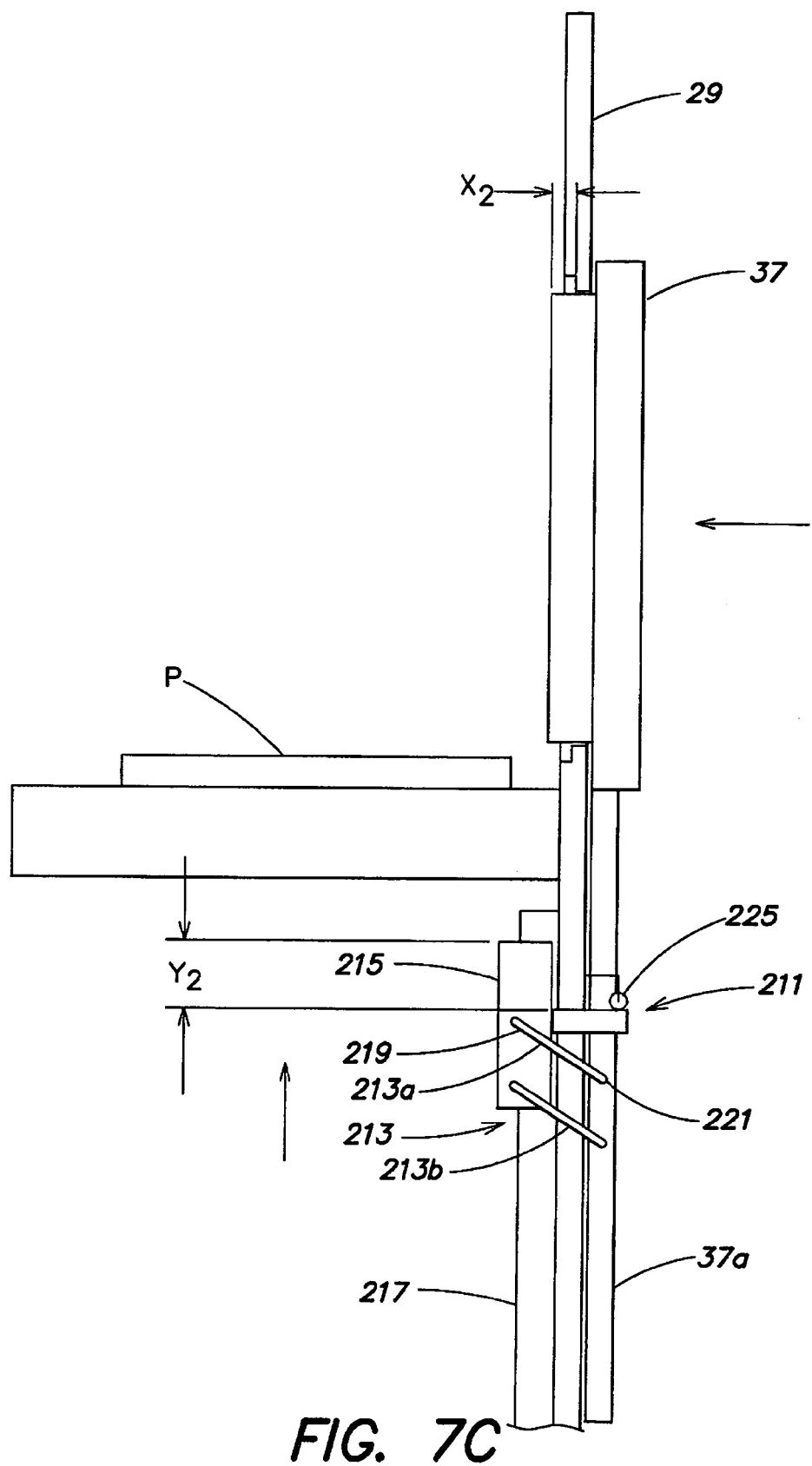

FIGS. 7A-C are schematic side elevational views of the automatic door opener 15. FIG. 7A shows the horizontally stationary mechanism 215 at the same elevation as the vertical motion stop (cam 211) causing the four bar link 213 to extend, pushing the pod door receiver 37 backward, away from the pod access port 35. FIG. 7B shows the horizontally stationary mechanism 215 having traveled a small distance $Y_1$ above the vertical motion stop (cam 211), causing the four bar link 213 to pull the pod door receiver 37 a corresponding distance inward resulting in a small protrusion $X_1$. FIG. 7C shows the horizontally stationary mechanism 215 having traveled a larger distance $Y_2$ above the vertical motion stop, causing the four bar link 213 to pull the pod door receiver 37 a corresponding distance inward resulting in a larger protrusion $X_2$.

In one aspect the programmable controller C allows a user to select a desired positive or negative gap between the surface of the docking platform side of the pod access opening 35, and the surface of the pod door receiver 37 closest to the docking platform P (i.e., the factory interface surface or FIMS gap). The FIMS gap control program may include either a look up table that translates a user desired FIMS gap into a corresponding motor current, or may include an algorithm for translating the user's desired FIMS gap into the corresponding motor current.

Automatic Door Opener Operation

In operation after the inventive automatic door opener 15 and factory interface chamber 19 have been coupled to the datum plate 41 as described above, the horizontal actuator 119 coupled to the docking platform P is actuated causing the docking platform P to move away from the datum plate 41 to the pod receiving position shown in FIG. 3A. The light beam emitted by the pod present sensor's emitter 151 is received by the detector 153 thereof, and the pod present sensor sends a signal to the controller C indicating that the docking platform P is vacant and a pod 107 may be placed thereon. Thereafter a pod 107 is placed on the pod platform P via automatic or manual methods.

Alignment pins 109 interface with features on the bottom of the standard pod 107 and kinimatically align the pod 107 on the docking platform P. Simultaneously therewith, the clamp 111 enters a corresponding opening 149 on the bottom of the standard pod 107, and the pod present sensor senses that a pod is present on the docking platform P. The controller C receives the pod present signal, and in response thereto rotates and retracts the clamp 111 to securely hold the pod 107 in place on the docking platform P. Further, as previously stated, the ID reader 141 may read at any time, the identification tag of the pod 107 clamped to the docking platform P.

The docking platform P may include three or more alignment pins adapted to interface with features on the bottom of a standard pod. A sensor may be positioned adjacent each alignment pin such that a standard pod would actuate all three sensors, and a controller coupled thereto would recognize that actuation of less than three sensors represents a pod is not properly positioned on the docking platform P. An alternative that may be employed comprises a pin having an integrated sensor such as a plunger that is depressed by a pod, and activates a sensor coupled to the plunger. Such an integrated sensor pin is described in U.S. patent application Ser. No. 09/894,383, filed Jun. 27, 2001 (AMAT No. 5770/ATD/BG), the entire disclosure of which is incorporated herein by this reference.

The horizontal actuator 119 is then signaled to begin moving the docking platform P toward the pod access port 35 formed in the interface wall 29. The rate at which the docking platform P moves is controlled by the controller C which maybe programmed to vary the speed, causing the docking platform P to slow down in the region adjacent the access port 35, so as to gradually contact the pod door receiver 37 which may be flush with the surface of the pod access port 35, may protrude therethrough or may be recessed from the surface of the pod access port 35, as described previously. As the pod door enters the recess of the pod door receiver 37, the pod door 175 is aligned by the alignment pins 187 contained in the recess thereof, and the key 133 enters the corresponding opening 139 on the door 125 of the sealed pod 107. After the pod door 175 gently contacts the pod door receiver 37, and is aligned within the recess thereof, the key 183 is rotated by the actuator so as to unlock the pod door 175 from the remainder of the pod. Because the key 183 has either a thinner head 197, or a longer base 195, both as described above, the key 183 does not rub against the inside of the pod door as the key 183 rotates.

Thereafter the robot 13 contained in the interface chamber 19 may extract substrates from the pod access opening 35 and transport them into the processing tool 17. During the entire process the pod 107 is securely held in place and is prevented from rocking or tilting via the retracted pod clamp 111. Because of the datum plate 41 and the pod clamp 111 the position of each component, including the pod 107, and the substrates contained therein, is accurate and repeatable. The inventive automatic door opener 15 provides much greater flexibility than prior art systems because of the programmed controller which allows control of the speeds of approach of the docking platform P, the speed at which the pod door receiver 37 is elevated and the protrusion of the pod door receiver (or FIMS gap). The programmed controller also allows contact between moving parts to be gentle yet provides faster motion during times when moving parts are not contacting.

The computer program code used to perform these functions may be (1) developed by a person of ordinary skill in the art; (2) written in any computer programming language; and/or (3) stored in a memory location of the controller C or in another memory location (not shown).

Magnetically Mounted Casing

One final feature of the inventive automatic door opener 15 facilitates assembly, and provides ease of access to the moving parts for both assembly and repair. Specifically, the moving parts of conventional automatic door openers typically are encased in thin sheets of metal, which serve both to encase particles and to improve the aesthetic appearance of the automatic door opener. Conventionally these metal sheets are fastened in place with screws or bolts. The inventive automatic door opener 15, however, may be encased with thin metal sheets (preferably burnished aluminum) that are secured in place via a plurality of magnets. The magnets may be fixedly mounted to a frame of the automatic door opener. Accordingly the metal sheets may be easily applied and removed from the inventive automatic door opener.

The foregoing description discloses only a preferred embodiment of the invention; modifications of the above disclosed apparatus which fall within the scope of the invention will be readily apparent to those of ordinary skill in the art. For instance, it will be apparent that the automatic door opener described above has a number of inventive features, each of which can be employed independently of the others. The lead screw type motion system described is merely exemplary, and any number of motion systems, keys, detectors, etc., may be employed. Similarly the specific position of the datum plate relative to the various components coupled thereto may vary, without affecting the function of the datum plate. The specific shape of the plate is not limited, and the term "plate" is not intended to limit the datum plate to any specific shape or dimension. Any object which provides the above described functionality of the datum plate may be considered to be a datum plate.

Accordingly, while the present invention has been disclosed in connection with exemplary embodiments thereof, it should be understood that other embodiments may fall within the spirit and scope of the invention, as defined by the following claim.

The invention claimed is:

1. A datum plate comprising:
   a set of predetermined attachment locations adapted to couple the datum plate to a chamber;
   a set of predetermined attachment locations adapted to couple one or more automatic door opener platforms to the datum plate;
   a set of predetermined attachment locations adapted to couple one or more substrate handlers contained within the chamber, to the datum plate; and
   a set of predetermined attachment locations adapted to couple a support frame, having one or more substrate carrier storage shelves and a substrate carrier handler coupled thereto, adjacent the platform;
   wherein the attachment locations are positioned such that when the datum plate is coupled to the chamber, and the automatic door opener platform and the substrate handler are coupled to the datum plate, the substrate handler and automatic door opener platform are aligned for substrate transfer therebetween; and wherein the attachment locations are positioned such that when the datum plate is coupled to the chamber, and the platform and support frame are coupled to the datum plate, the substrate carrier handler, the platform, and the storage shelves are aligned for substrate carrier transfer therebetween.

2. The datum plate of claim 1 wherein the attachment locations comprise predrilled holes.

3. The datum plate of claim 1 further comprising:
a set of predetermined attachment locations adapted to couple an automation module to the datum plate.

4. The datum plate of claim 3 wherein the automation module comprises a substrate orienter.

5. The datum plate of claim 3 wherein the automation module comprises a substrate centerfinder.

6. The datum plate of claim 3 wherein the automation module comprises an ID reader.

7. The datum plate of claim 3 wherein the automation module comprises a metrology/inspection station.

8. The datum plate of claim 1 wherein the substrate storage shelves are for storage within the chamber.

9. The datum plate of claim 1 further comprising a set of predetermined attachment locations adapted to couple a substrate storage location to the datum plate.

10. The datum plate of claim 9 wherein the attachment locations are positioned such that when the datum plate is coupled to the chamber, and the substrate handler and storage location are coupled to the datum plate, the substrate handler and storage location are aligned for substrate transfer therebetween.

11. A substrate handling system, comprising:
a support frame;
a datum plate having a set of attachment mechanisms for fixing the relative X, Y and Z positions of the datum plate and an apparatus coupled to the datum plate, the datum plate being coupled to the support frame via the set of attachment mechanisms;
a substrate handler coupled to the datum plate via the set of attachment mechanisms;
at least one automatic door opener platform coupled to the datum plate via the set of attachment mechanisms;
an additional support frame coupled to the datum plate via the set of attachment mechanisms; and wherein the additional support frame comprises a substrate carrier handler adapted to transport substrate carriers between a plurality of the automatic door opener platforms coupled to the datum plate; and
at least one substrate carrier storage shelf coupled to the additional support frame.

12. The system of claim 11 wherein the support frame is a chamber.

13. The system of claim 11 wherein the support frame further comprises adjustable leveling feet.

14. The system of claim 13 wherein the datum plate further comprises a level finder attached thereto.

15. The system of claim 11 further comprising at least one substrate storage location coupled to the datum plate via the set of attachment mechanisms.

16. The system of claim 11 further comprising an automation module coupled to the datum plate via the set of attachment mechanisms.

17. The system of claim 11 wherein the additional support frame further comprises adjustable leveling feet.

18. A method of installing substrate handling equipment comprising:
providing a support frame;
coupling a datum plate to the support frame;
coupling a substrate handler to predetermined mounting locations on the datum plate;
coupling at least one automatic door opener platform to predetermined mounting locations on the datum plate;
coupling an additional support frame to predetermined mounting locations on the datum plate, the additional support frame having a substrate carrier handler coupled thereto and adapted to transport substrate carriers between a plurality of the automatic door opener platforms; and
coupling at least one substrate carrier support shelf to the additional frame.

19. The method of claim 18 further comprising adjusting the level of the datum plate by adjusting leveling feet coupled to the support frame.

20. The method of claim 18 further comprising coupling at least one substrate storage location to predetermined mounting locations on the datum plate.

21. The method of claim 18 further comprising coupling an automation module to predetermined mounting locations on the datum plate.

22. A datum plate comprising:
a set of predetermined attachment locations adapted to couple the datum plate to a chamber;
a set of predetermined attachment locations adapted to couple one or more automatic door opener platforms to the datum plate;
a set of predetermined attachment locations adapted to couple one or more substrate handlers contained within the chamber, to the datum plate; and
a set of predetermined attachment locations adapted to couple a substrate storage location to the datum plate;
wherein the attachment locations are positioned such that when the datum plate is coupled to the chamber, and the automatic door opener platform and the substrate handler are coupled to the datum plate, the substrate handler and automatic door opener platform are aligned for substrate transfer therebetween.

23. The apparatus of claim 22 wherein the attachment locations are positioned such that when the datum plate is coupled to the chamber, and the substrate handler and storage location are coupled to the datum plate, the substrate handler and storage location are aligned for substrate transfer therebetween.

24. A substrate handling system, comprising:
a support frame;
a datum plate having a set of attachment mechanisms for fixing the relative X, Y and Z positions of the datum plate and an apparatus coupled to the datum plate, the datum plate being coupled to the support frame via the set of attachment mechanisms;
a substrate handler coupled to the datum plate via the set of attachment mechanisms;
at least one automatic door opener platform coupled to the datum plate via the set of attachment mechanisms; and
at least one substrate storage location coupled to the datum plate via the set of attachment mechanisms.

25. A method of installing substrate handling equipment comprising:
providing a support frame;
coupling a datum plate to the support frame;
coupling a substrate handler to predetermined mounting locations on the datum plate;

coupling at least one automatic door opener platform to predetermined mounting locations on the datum plate; and coupling at least one substrate storage location to predetermined mounting locations on the datum plate.

26. A datum plate comprising:

a set of predetermined attachment locations adapted to couple the datum plate to a chamber;

a set of predetermined attachment locations adapted to couple one or more automatic door opener platforms to the datum plate;

a set of predetermined attachment locations adapted to couple one or more substrate handlers contained within the chamber, to the datum plate;

a set of predetermined attachment locations adapted to couple a support frame, having one or more substrate carrier storage shelves, adjacent the platform, wherein the attachment locations are positioned such that when the datum plate is coupled to the chamber, and the automatic door opener platform and the substrate handler are coupled to the datum plate, the substrate handler and automatic door opener platform are aligned for substrate transfer therebetween; and a set of predetermined attachment locations adapted to couple a substrate storage location to the datum plate, wherein the attachment locations are positioned such that when the datum plate is coupled to the chamber, and the substrate handler and storage location are coupled to the datum plate, the substrate handler and storage location are aligned for substrate transfer therebetween.

27. The datum plate of claim 26 wherein the attachment locations comprise predrilled holes.

28. The datum plate of claim 26 further comprising:

a set of predetermined attachment locations adapted to couple an automation module to the datum plate.

29. The datum plate of claim 28 wherein the automation module comprises a substrate orienter.

30. The datum plate of claim 28 wherein the automation module comprises a substrate centerfinder.

31. The datum plate of claim 28 wherein the automation module comprises an ID reader.

32. The datum plate of claim 28 wherein the automation module comprises a metrology/inspection station.

33. The datum plate of claim 28 further comprising a set of predetermined attachment locations adapted to couple a substrate storage location to the datum plate.

34. The datum plate of claim 33 wherein the substrate storage location is for storage within the chamber.

* * * * *